(12) United States Patent
Hsiao

(10) Patent No.: US 7,674,688 B2
(45) Date of Patent: Mar. 9, 2010

(54) SAWING METHOD FOR A SEMICONDUCTOR ELEMENT WITH A MICROELECTROMECHANICAL SYSTEM

(75) Inventor: Wei-Min Hsiao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/051,896

(22) Filed: Mar. 20, 2008

(65) Prior Publication Data
US 2009/0042367 A1    Feb. 12, 2009

(30) Foreign Application Priority Data
Aug. 10, 2007    (TW) .............................. 96129740 A

(51) Int. Cl.
*H01L 21/00* (2006.01)
(52) U.S. Cl. ...................................... 438/460; 438/642
(58) Field of Classification Search .................. 438/460, 438/642
See application file for complete search history.

(56) References Cited

U.S. PATENT DOCUMENTS

| | | | |
|---|---|---|---|
| 6,573,157 B1 * | 6/2003 | Sato ........................... 438/462 |
| 6,852,608 B2 * | 2/2005 | Kitamura et al. ............ 438/464 |
| 7,033,914 B2 * | 4/2006 | Yee ............................. 438/460 |
| 2005/0126686 A1 * | 6/2005 | Cheong et al. .............. 156/153 |
| 2005/0255675 A1 * | 11/2005 | Farnworth et al. .......... 438/460 |
| 2006/0078137 A1 * | 4/2006 | Su et al. ..................... 381/191 |

* cited by examiner

*Primary Examiner*—Ha Tran T Nguyen
*Assistant Examiner*—Shantanu C Pathak
(74) *Attorney, Agent, or Firm*—Volentine & Whitt, P.L.L.C.

(57) ABSTRACT

A sawing method for a Micro Electro-Mechanical Systems (MEMS) semiconductor device, wherein a gum material is disposed between a wafer having at least one MEMS and a carrier, and the gum material is disposed around the MEMS. The wafer is sawed according to the position correspondingly above the gum material. Finally, the carrier and the gum material are removed. By disposing the gum material between the carrier and the wafer, the MEMS are protected, and the wafer and the MEMS can avoid the pollution of water and foreign material, so that the yield can be improved. Furthermore, the wafer is sawed from the backside till the gum material without sawing through the gum material, so that the carrier is not sawed. Therefore, the carrier can be reused, such that the cost is reduced.

17 Claims, 10 Drawing Sheets

SAWING METHOD FOR A SEMICONDUCTOR ELEMENT WITH A MICROELECTROMECHANICAL SYSTEM

BACKGROUND OF THE INVENTION

1. Field of the Invention

The present invention relates to a sawing method for a semiconductor device. More particularly, the present invention relates to a sawing method for a MEMS semiconductor device.

2. Description of the Related Art

Referring to FIGS. 1A to 1B, schematic views of a conventional sawing method for a MEMS semiconductor device are shown. Referring to FIG. 1A, firstly, a wafer 11 having at least one MEMS structure 12 is provided. Referring to FIG. 1B, the wafer 11 is sawed on a periphery of the MEMS 12 according to a plurality of sawing lines (as shown by dashed lines) on the wafer 11, so as to form a MEMS semiconductor device 1.

In the conventional sawing method for the MEMS semiconductor device, the wafer 11 is sawed directly according to the sawing lines on the wafer 11. Therefore, during the sawing process, it is impossible to protect the MEMS structure 12 from being damaged, and the wafer 11 and the MEMS structure 12 may be polluted by water or foreign material, thereby reducing the yield of the process.

Consequently, there is an existing need for providing a sawing method for the MEMS semiconductor device to solve the above-mentioned problems.

SUMMARY OF THE INVENTION

The present invention is directed to a sawing method for a MEMS semiconductor device, which includes: (a) providing a first carrier; (b) providing a wafer having a plurality of MEMS structures; (c) disposing a gum material between the first carrier and the wafer, in which the gum material is disposed around the MEMS structures and corresponding to a plurality of predetermined sawing lines; (d) sawing the wafer according to the predetermined sawing lines; and (e) removing the first carrier and the gum material.

In the sawing method for the MEMS semiconductor device of the present invention, the gum material is disposed between the first carrier and the wafer, so as to protect the MEMS structure from being damaged during the sawing process, and to protect the wafer and MEMS structure from being polluted by the water or the foreign material, thereby improving the yield of the process. Further, in the present invention, the wafer is sawed from a backside till the gum material without sawing through the gum material, so the first carrier can be reused, such that the production cost is reduced.

DETAILED DESCRIPTION OF THE INVENTION

Figure 1A:
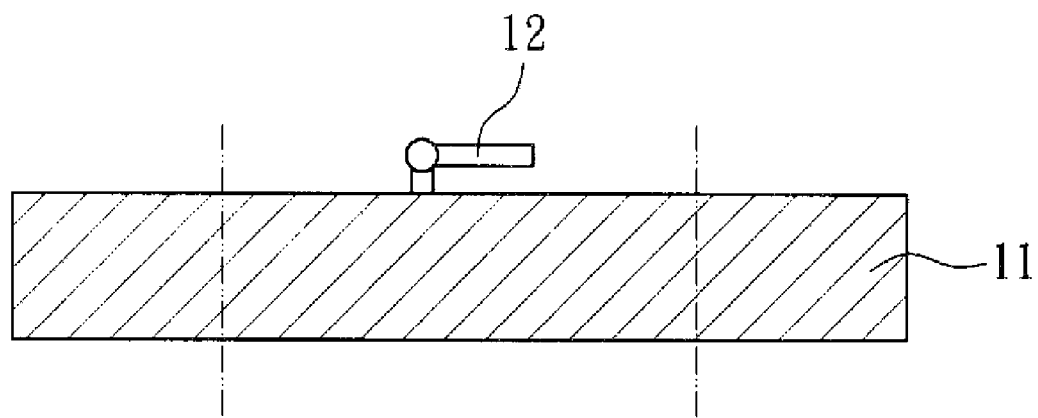
FIG. 1A is a schematic view of a conventional MEMS semiconductor wafer.
Figure 1B:
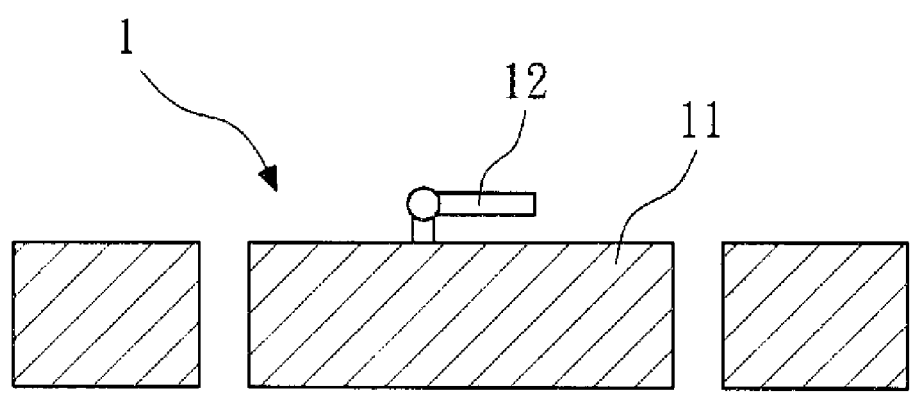
FIG. 1B is a schematic view of conventionally sawing the MEMS semiconductor wafer.
Figure 2:
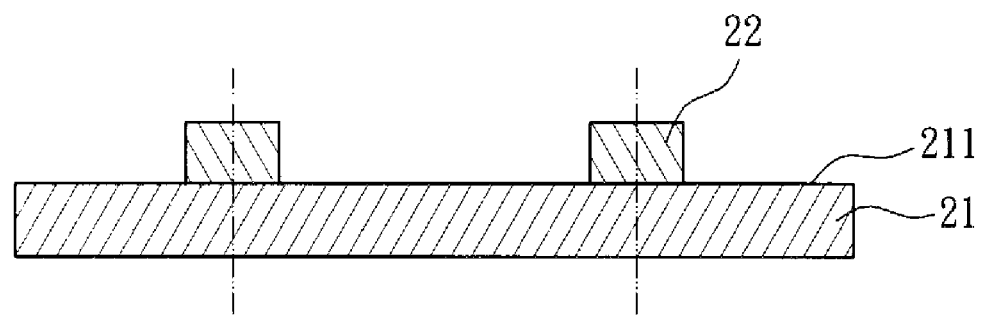
FIG. 2 is a schematic view of disposing a gum material on a first carrier according to a first embodiment of the present invention.

FIGS. 2 to 5 are schematic views of a sawing method for a MEMS semiconductor device according to a first embodiment of the present invention. Referring to FIG. 2, firstly, a first carrier 21 is provided. Preferably, the first carrier 21 is of silicon, glass, or sapphire material. Next, a gum material 22 is disposed on a surface 211 of the first carrier 21. In this embodiment, the gum material 22 is an adhesive material. It should be noted that the gum material 22 could also be a light sensitive material (capable of being removed after being irradiated by a light source) or a heat sensitive material (capable of being removed after being heated by a heat source).

Figure 3A:
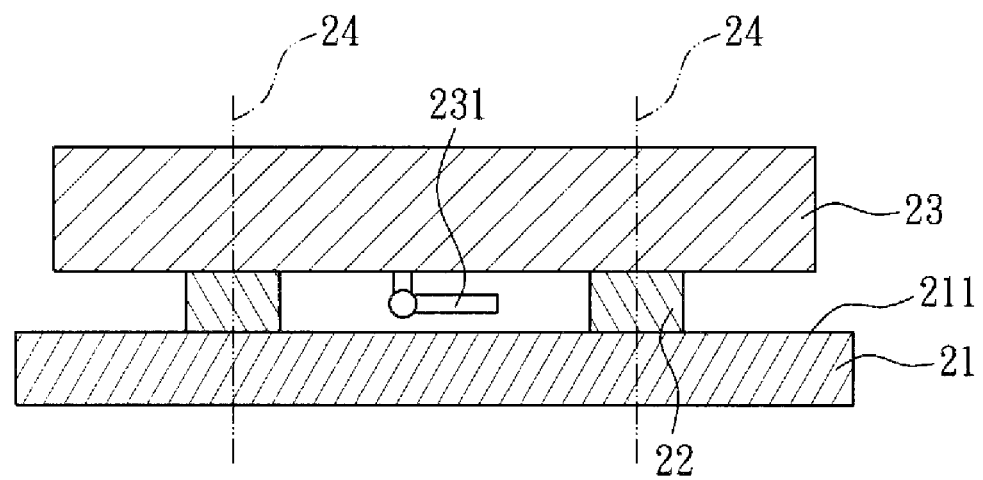
FIG. 3A is a schematic view of disposing a MEMS semiconductor wafer on the gum material according to the first embodiment of the present invention.

Referring to FIG. 3A, a wafer 23 is disposed on the gum material 22, and the wafer 23 has a plurality of MEMS structures 231 (only one MEMS structure 231 is used as a representative of illustration). The gum material 22 is disposed between the first carrier 21 and the wafer 23, and the gum material 22 is disposed around the MEMS structure 231 and corresponding to a plurality of predetermined sawing lines (as shown by dashed lines). It should be noted that in the present invention, the gum material 22 may be firstly disposed on the surface of the wafer 23, and then the first carrier 21 is further disposed on the gum material 22. In this embodiment, the MEMS structure 231 is an optical device. In other applications, the MEMS structure 231 can be a micro-motion structure, or the MEMS structure 231 may be a light sensor region.

Figure 3B:
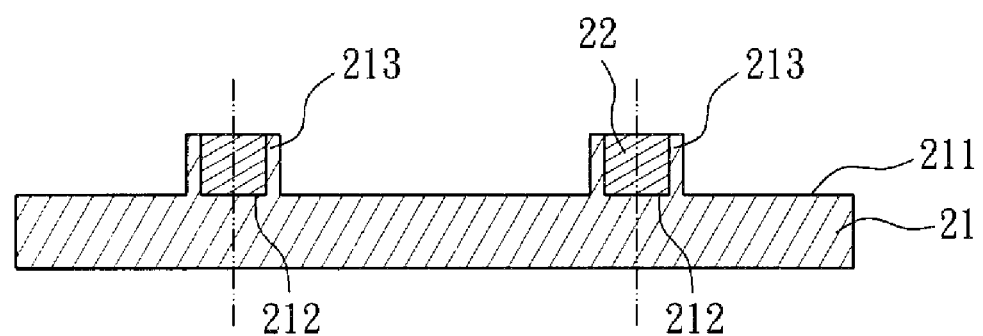
FIG. 3B is a schematic view of disposing the gum material in slot channels of the first carrier according to the first embodiment of the present invention.
Figure 3C:
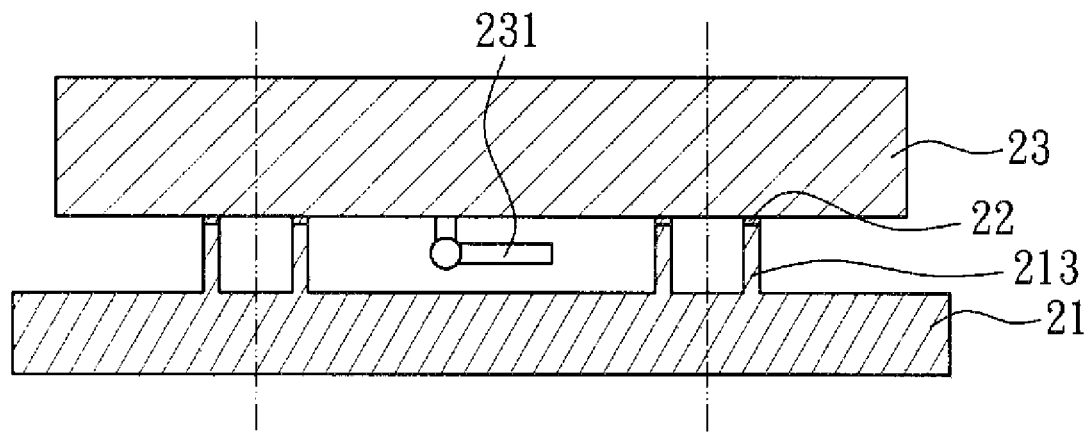
FIG. 3C is a schematic view of disposing the gum material on protruding portions of the first carrier according to the first embodiment of the present invention.
Figure 3D:
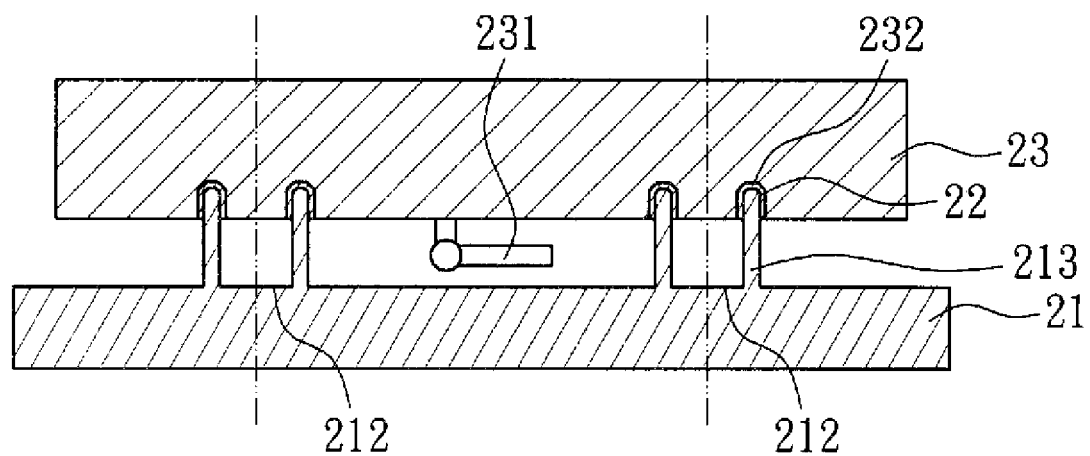
FIG. 3D is a schematic view of disposing the gum material in recesses of the wafer according to the first embodiment of the present invention.
Figure 3E:
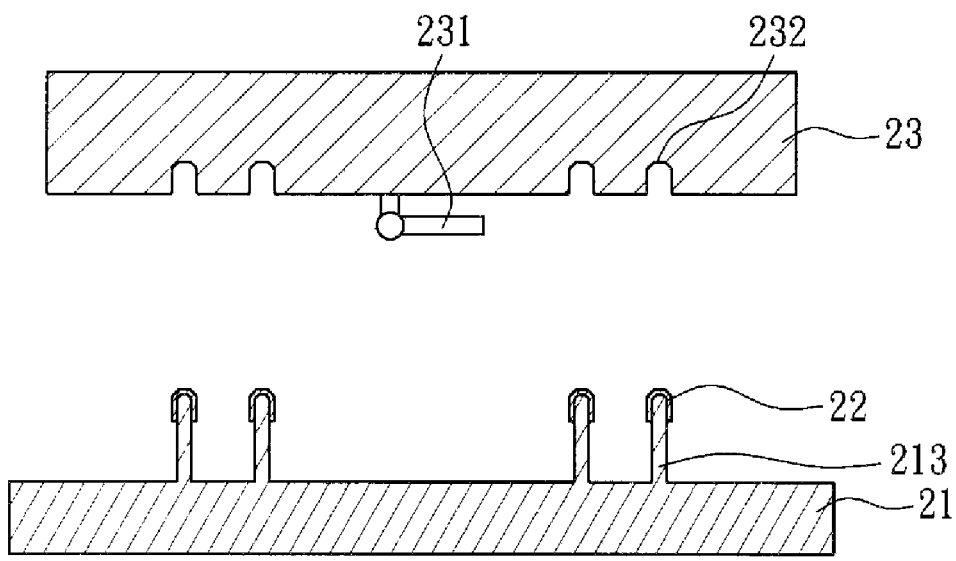
FIG. 3E is a schematic view of firstly disposing the gum material on the protruding portions of the first carrier and then combining the wafer and the first carrier according to the first embodiment of the present invention.
Figure 3F:
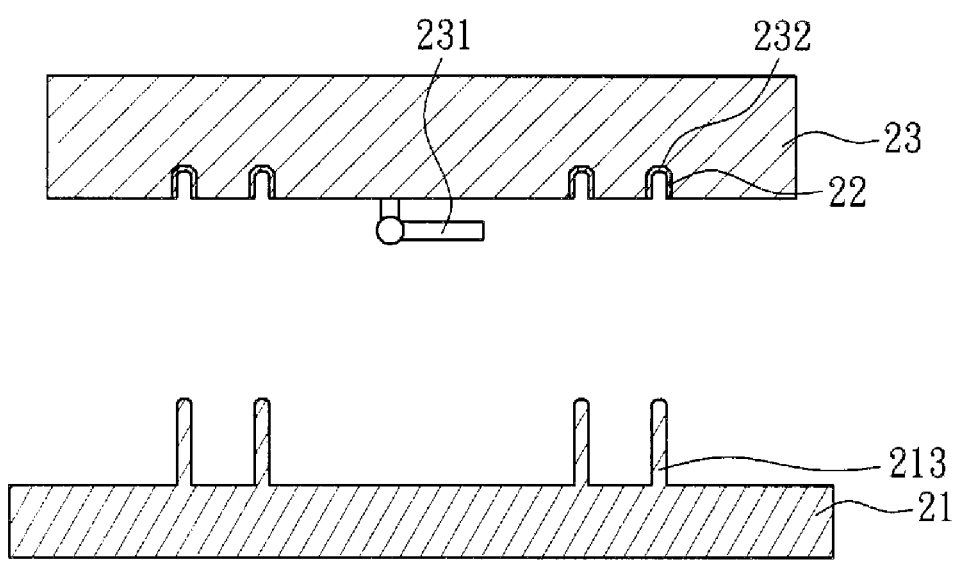
FIG. 3F is a schematic view of firstly disposing the gum material in the recesses of the wafer and then combining the wafer and the first carrier according to the first embodiment of the present invention.

Referring to FIG. 3B, in other applications, the surface 211 of the first carrier 21 has a plurality of slot channels 212, and each slot channel 212 is defined by two protruding portions 213 on the surface 211. Preferably, the gum material 22 is disposed in the slot channels 212. In addition, the gum material 22 may also be disposed on the protruding portions 213 (as shown in FIG. 3C). Alternatively, the wafer 23 may have a plurality of recesses 232, and the recesses 232 are disposed corresponding to the protruding portions 213 (as shown in FIG. 3D). It should be noted that the gum material 22 may be firstly disposed on the protruding portions 213, and the recesses 232 of the wafer 23 are engaged with the protruding portions 213 (as shown in FIG. 3E). Alternatively, the gum material 22 may be firstly disposed in the recesses 232 of the wafer 23, and then the protruding portions 213 are engaged with the recesses 232 (as shown in FIG. 3F).

Figure 4A:
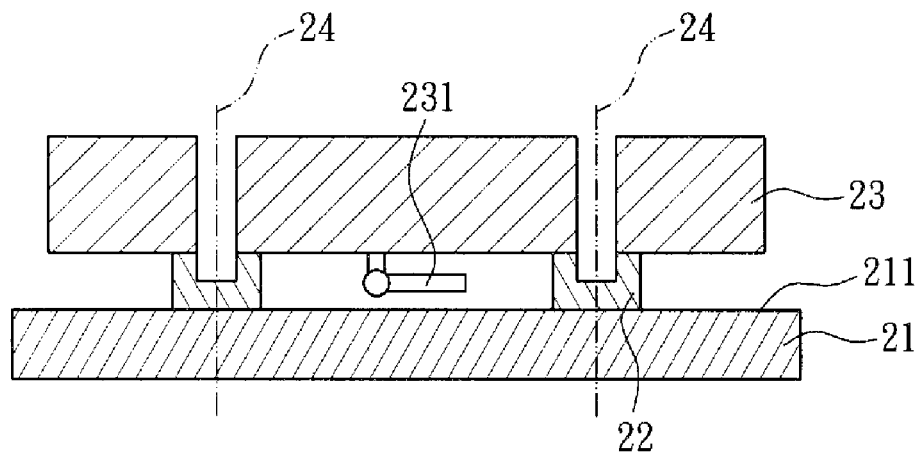
FIG. 4A is a schematic view of sawing the wafer according to the first embodiment of the present invention.
Figure 4B:
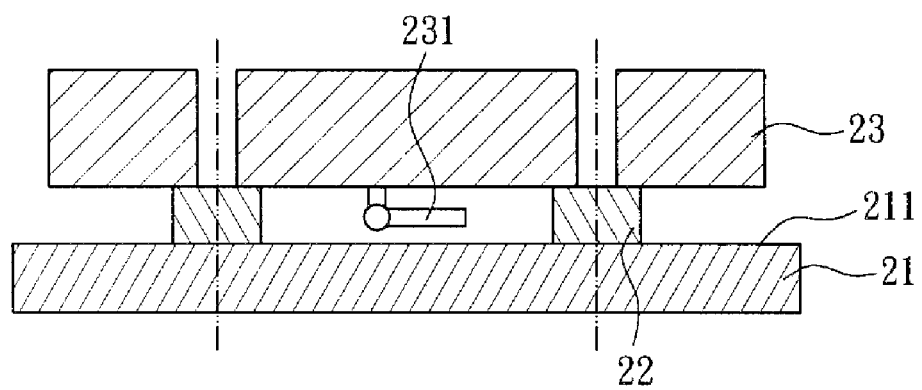
FIG. 4B is a schematic view of another aspect of sawing the wafer according to the first embodiment of the present invention.

Referring to FIG. 4A, the wafer 23 is sawed according to the predetermined sawing lines 24. In this embodiment, the wafer 23 is sawed by water-cutting till a part of the gum material 22, so as form a notch on the gum material 22. In other applications, the wafer 23 may also be sawed till a contact surface of the gum material 22 and the wafer 23, as shown in FIG. 4B.

Figure 5:
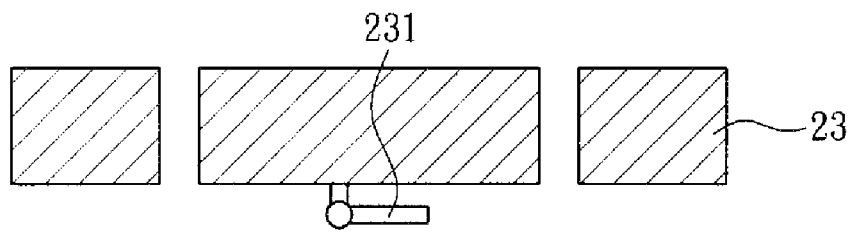
FIG. 5 is a schematic view of the wafer finishing sawing according to the first embodiment of the present invention.

Referring to FIG. 5, finally, the first carrier 21 and the gum material 22 are removed, so as to finish the sawing method for the MEMS semiconductor device of the present invention.

In the sawing method for the MEMS semiconductor device according to the first embodiment of the present invention, the gum material 22 is disposed between the first carrier 21 and the wafer 23, so as to protect the MEMS structure 231 from being damaged during the sawing process, and to protect the wafer 23 and the MEMS structure 231 from being polluted by water or foreign material, thereby improving the yield of the process. Further, in the present invention, the wafer 23 is sawed from the backside till the gum material 22 without sawing through the gum material 22, such that the first carrier 21 can be reused, so as to reduce the production cost.

Figure 6:
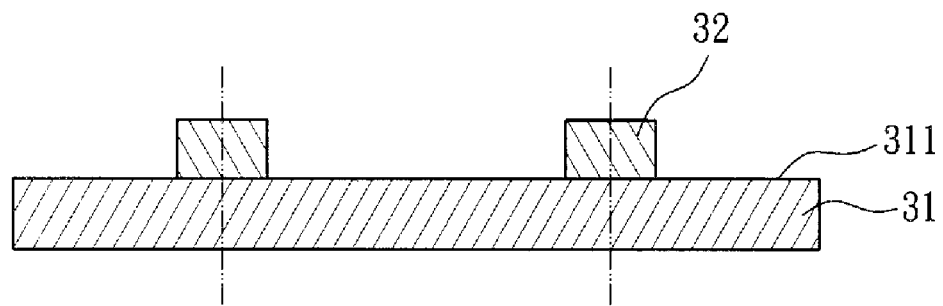
FIG. 6 is a schematic view of disposing the gum material on a first carrier according to a second embodiment of the present invention.

FIGS. 6 to 10 are schematic views of the sawing method for the MEMS semiconductor device of a second embodiment of the present invention. Referring to FIG. 6, firstly, a first carrier 31 is provided. Preferably, the first carrier 31 is of silicon, glass, or sapphire material. Next, a gum material 32 is disposed on a surface 311 of the first carrier 31. The gum material 32 is an adhesive material. It should be noted that the gum material 32 may also be a light sensitive material (capable of being removed after being irradiated by a light source) or a heat sensitive material (capable of being removed after being heated by a heat source).

Figure 7A:
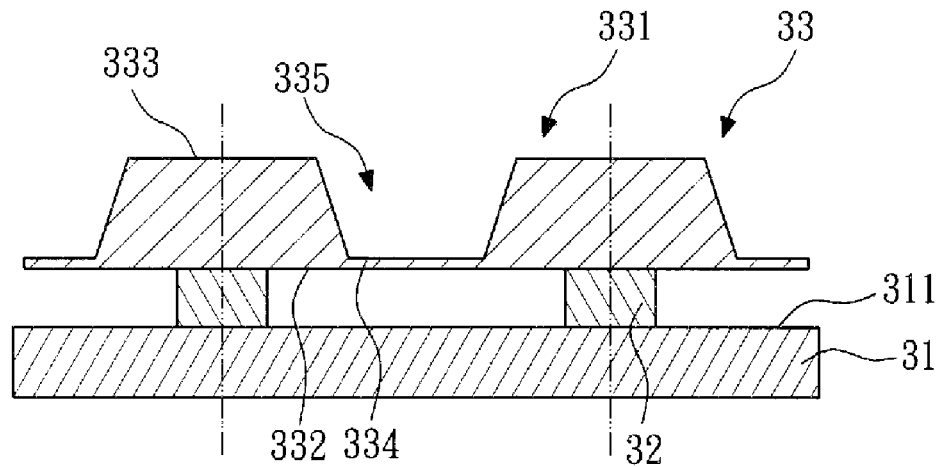
FIG. 7A is a schematic view of disposing a MEMS semiconductor wafer on the gum material according to the second embodiment of the present invention.

Referring to FIG. 7A, a wafer 33 is disposed on the gum material 32, the wafer 33 has a plurality of MEMS microphone units 331 (only one MEMS microphone unit 331 is used as a representative of illustration), a first surface 332, and a second surface 333, in which the second surface 333 corresponds to the first surface 332. The MEMS microphone unit 331 has a vibrating thin film 334 and a depressed portion 335, in which the depressed portion 335 is correspondingly located above the vibrating thin film 334, the vibrating thin film 334 is disposed on the first surface 332, and the depressed portion 335 is formed on the second surface 333. The gum material 32 is disposed between the first carrier 31 and the first surface 332 of the wafer 33, and the gum material 32 is disposed around the vibrating thin film 334 and corresponding to a plurality of predetermined sawing lines (as shown by dashed lines). It should be noted that in the present invention, the gum material 32 may be firstly disposed on the surface of the wafer 33, and then the first carrier 31 is disposed on the gum material 32.

Figure 7B:
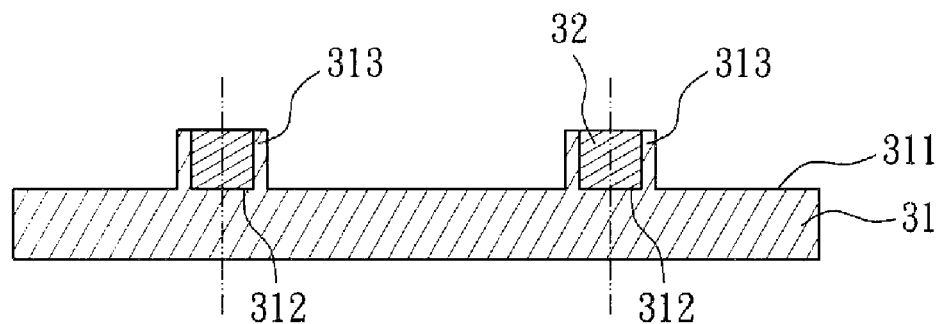
FIG. 7B is a schematic view of disposing the gum material in the slot channels of the first carrier according to the second embodiment of the present invention.
Figure 7C:
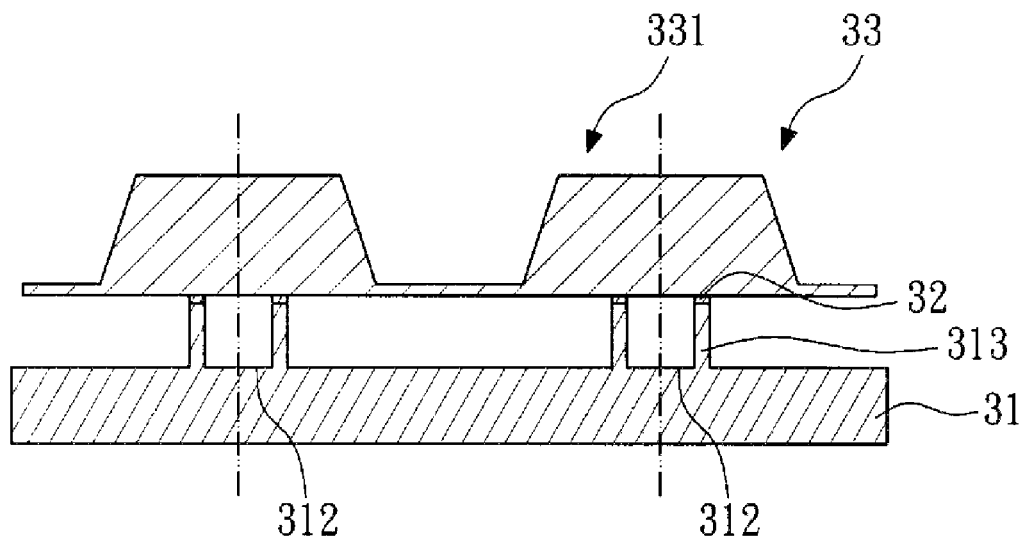
FIG. 7C is a schematic view of disposing the gum material on the protruding portions of the first carrier according to the second embodiment of the present invention.
Figure 7D:
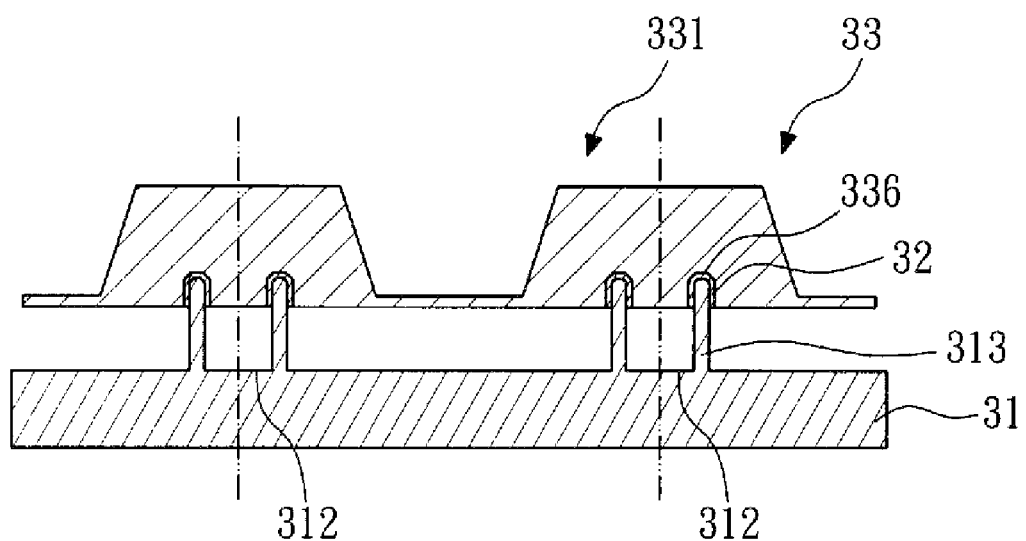
FIG. 7D is a schematic view of disposing the gum material in the recesses of the wafer according to the second embodiment of the present invention.
Figure 7E:
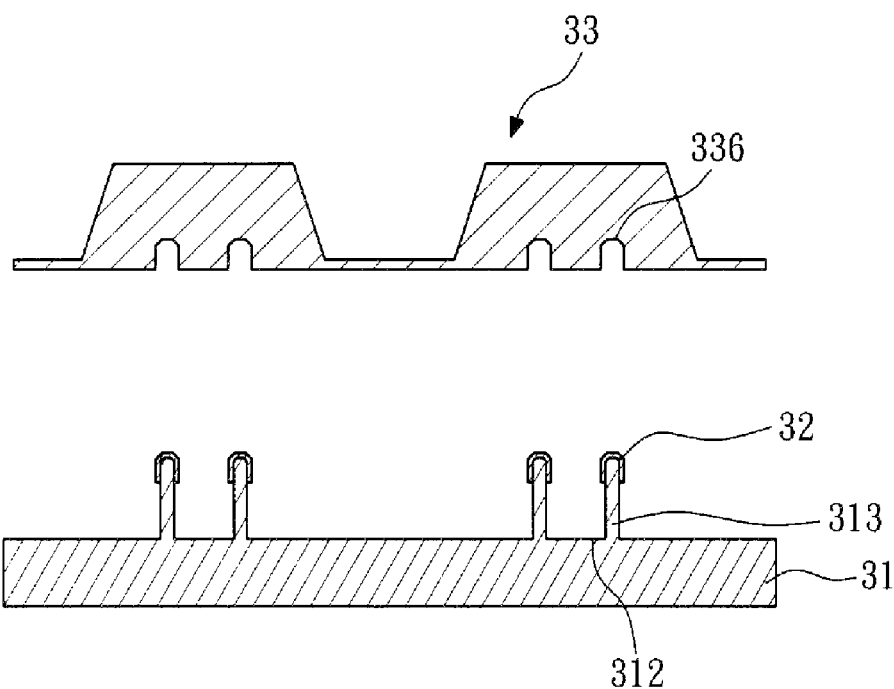
FIG. 7E is a schematic view of firstly disposing the gum material on the protruding portions of the first carrier and then combining the wafer and the first carrier according to the second embodiment of the present invention.
Figure 7F:
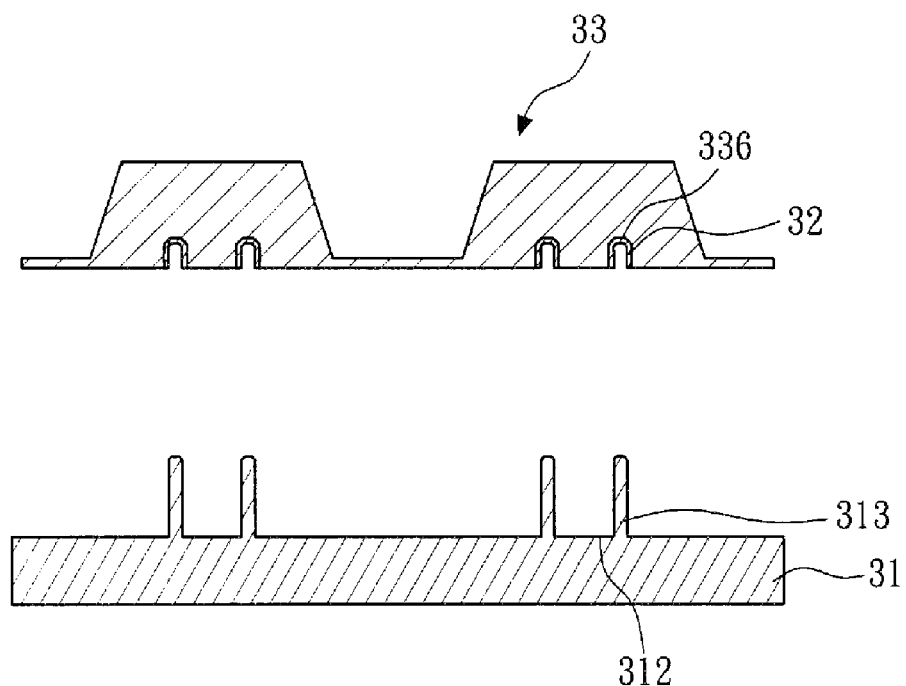
FIG. 7F is a schematic view of firstly disposing the gum material in the recesses of the wafer and then combining the wafer and the first carrier according to the second embodiment of the present invention.

Referring to FIG. 7B, in other applications, the surface 311 of the first carrier 31 has a plurality of slot channels 312, and each slot channel 312 is defined by two protruding portions 313 on the surface 311. Preferably, the gum material 32 is disposed in the slot channels 312. In addition, the gum material 32 may also be disposed on the protruding portions 313 (as shown in FIG. 7C). Alternatively, the wafer 33 can have a plurality of recesses 336, and the recesses 336 are located corresponding to the protruding portions 313 (as shown in FIG. 7D). It should be noted that the gum material 32 may be firstly disposed on the protruding portions 313, and the recesses 336 of the wafer 33 are engaged with the protruding portions 313 (as shown in FIG. 7E). Alternatively, the gum material 22 may be firstly disposed in the recesses 336 of the wafer 33, and then the protruding portions 313 are engaged with the recesses 336 (as shown in FIG. 7F).

Figure 8:
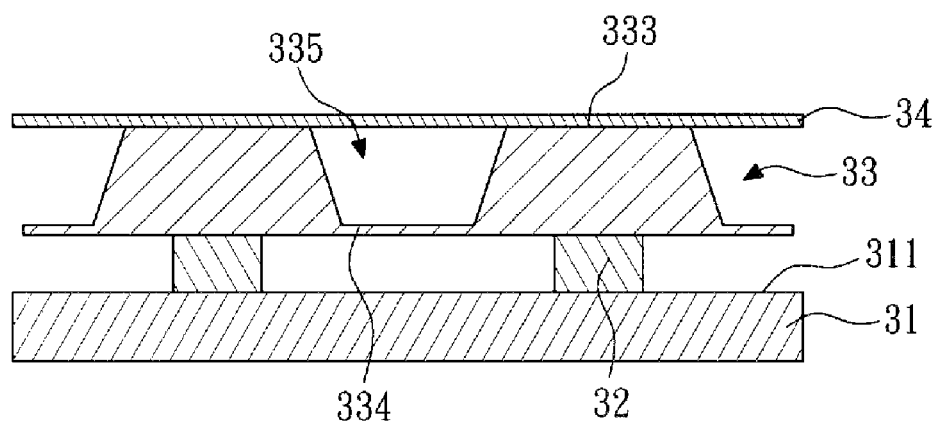
FIG. 8 is a schematic view of disposing a protection thin film on the MEMS semiconductor wafer according to the second embodiment of the present invention.

Referring to FIG. 8, a protection thin film 34 is formed on the second surface 333 of the wafer 33 and covers the depressed portion 335. It should be noted that the step of forming protection thin film 34 may be selectively finished before the step of disposing the wafer 33 on the gum material 32. In this embodiment, the protection thin film 34 is formed by adhering. Preferably, the protection thin film 34 is epoxy.

Figure 9A:
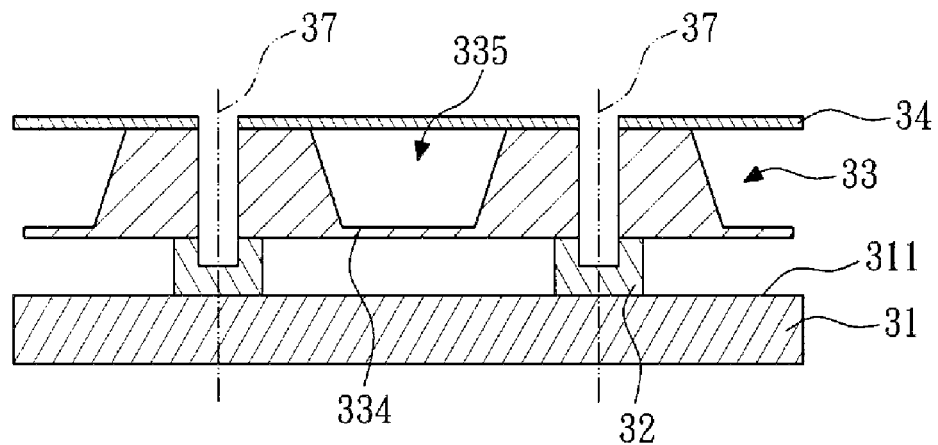
FIG. 9A is a schematic view of sawing the wafer according to the second embodiment of the present invention.
Figure 9B:
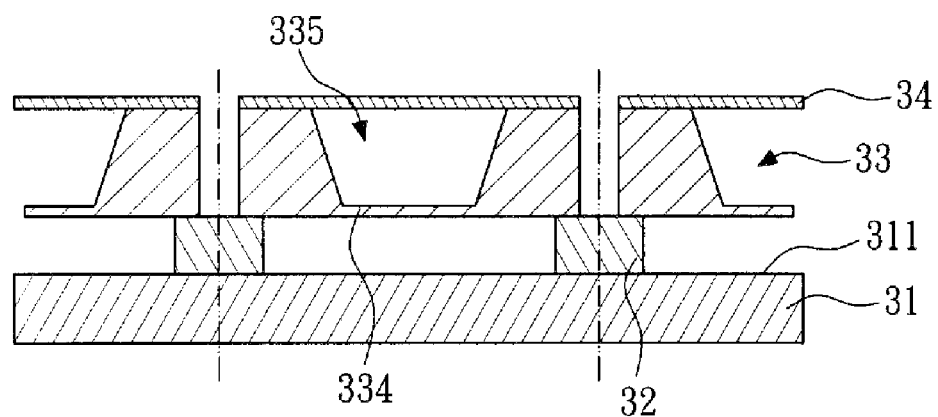
FIG. 9B is a schematic view of another aspect of sawing the wafer according to the second embodiment of the present invention.

Referring to FIG. 9A, the protection thin film 34 and the wafer 33 are sawed according to the predetermined sawing lines 37. In this embodiment, the wafer 33 is sawed by water-cutting till a part of the gum material 32, so as to form a notch on the gum material 32. In other applications, the wafer 33 may also be sawed till a contact surface of the gum material 32 and the wafer 33, as shown in FIG. 9B.

Figure 10:
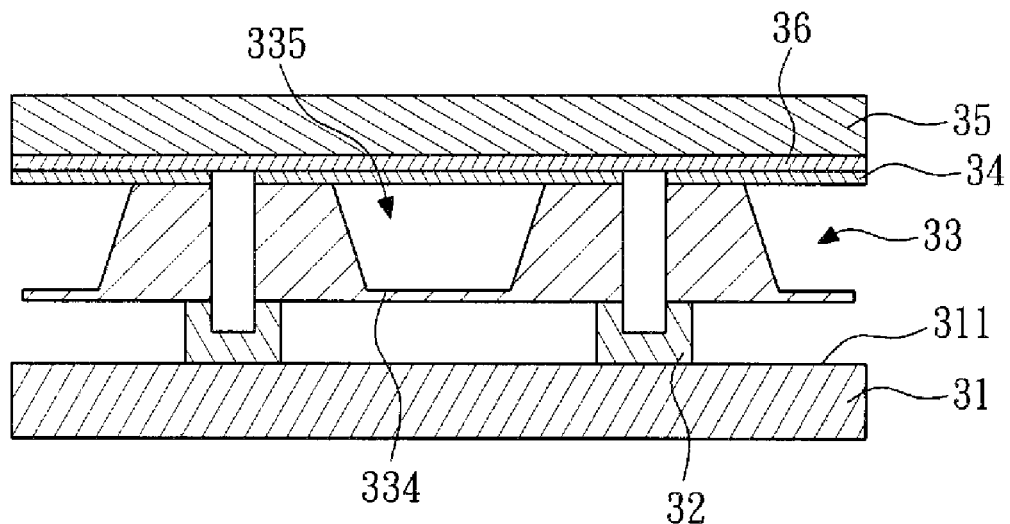
FIG. 10 is a schematic view of disposing a second carrier on the protection thin film according to the second embodiment of the present invention.
Figure 11:
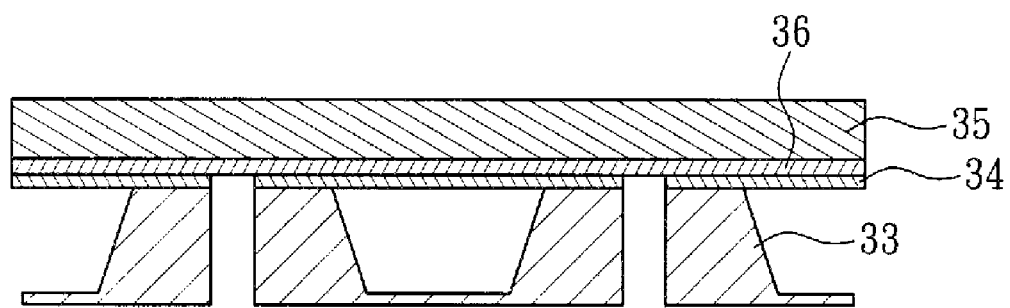
FIG. 11 is a schematic view of removing the first carrier and the gum material according to the second embodiment of the present invention.

Referring to FIG. 10, a second carrier 35 is disposed on the protection thin film 34. Preferably, the second carrier 35 and the protection thin film 34 are combined by using an adhesive material 36. Referring to FIG. 11, finally, the first carrier 31 and the gum material 32 are removed, so as to finish the flow of sawing the MEMS semiconductor device of the present invention.

In the sawing method for the MEMS semiconductor device according to the second embodiment of the present invention, the gum material 32 is disposed between the first carrier 31 and the wafer 33, and the protection thin film 34 covers the depressed portion 335, so as to protect the vibrating thin film 334 from being damaged during the sawing process, and to protect the wafer 33 and the vibrating thin film 334 from being polluted by water or foreign material, thereby improving the yield of the process. Further, in the present invention, the wafer 33 is sawed from the backside till the gum material 32 without sawing through the gum material 32, such that the first carrier 35 can be reused, so as to reduce the production cost.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A sawing method for a micro electro-mechanical systems (MEMS) semiconductor device, comprising: (a) providing a first carrier; (b) providing a wafer having a plurality of MEMS structures; (c) disposing a gum material between the first carrier and the wafer, wherein the gum material is disposed around the MEMS structures and corresponding to a plurality of predetermined sawing lines; (d) sawing the wafer according to the predetermined sawing lines, whereby the wafer is cutoff and the first carrier is not cut; and (e) removing the first carrier and the gum material; wherein in step (a), the first carrier is of silicon, glass, or sapphire material.

2. The sawing method according to claim 1, wherein step (c) comprises:
   (c1) disposing the gum material on the first carrier; and
   (c2) disposing the wafer on the gum material.

3. The sawing method according to claim 2, wherein in step (c1), a surface of the first carrier has a plurality of slot channels, and each slot channel is defined by two protruding portions on the surface.

4. The sawing method according to claim 3, wherein the gum material is disposed in the slot channels.

5. The sawing method according to claim 3, wherein the gum material is disposed on the protruding portions.

6. The sawing method according to claim 5, wherein in step (b), the method further comprises a step of forming a plurality of recesses on the wafer, and the recesses are located corresponding to the protruding portions.

7. The sawing method according to claim 6, wherein the gum material is firstly disposed on the protruding portions, and the recesses of the wafer are engaged with the protruding portions.

8. The sawing method according to claim 1, wherein step (c) comprises:
   (c1) disposing the gum material on a surface of the wafer; and
   (c2) disposing the first carrier on the gum material.

9. The sawing method according to claim 1, wherein in step (d), the wafer is sawed by water-cutting.

10. The sawing method according to claim 1, wherein in step (d), the wafer is sawed till a contact surface of the gum material and the wafer.

11. The sawing method according to claim 1, wherein in step (d), the wafer is sawed till a part of the gum material.

12. The sawing method according to claim 1, wherein in step (b), the wafer has a plurality of MEMS microphone units, a first surface, and a second surface, each MEMS microphone unit has a vibrating thin film, and a depressed portion, the depressed portion is correspondingly located above the vibrating thin film, the vibrating thin film is disposed on the first surface, and the depressed portion is formed on the second surface.

13. The sawing method according to claim 12, wherein in stop (c), the gum material is disposed between the first carrier and the first surface of the wafer, and is disposed around the vibrating thin films and corresponding to the predetermined sawing lines.

14. The sawing method according to claim 13, wherein before step (d), the method further comprises a step of forming a protection thin film on the second surface of the water and covering the depressed portion.

15. The sawing method according to claim 14, wherein the protection thin film is epoxy.

16. The sawing method according to claim 14, wherein after step (d), the method further comprises a step of disposing a second carrier on the protection thin film.

17. The sawing method according to claim 16, wherein the second carrier and the protection thin film are combined by an adhesive material.

* * * * *